United States Patent
Kwone et al.

(10) Patent No.: US 12,384,805 B2
(45) Date of Patent: Aug. 12, 2025

(54) IODINE-CONTAINING METAL COMPOUND AND COMPOSITION FOR DEPOSITING THIN FILM INCLUDING THE SAME

(71) Applicant: DNF CO., LTD., Daejeon (KR)

(72) Inventors: Yong Hee Kwone, Daejeon (KR); Young Jae Im, Daejeon (KR); Sang Yong Jeon, Daejeon (KR); Tae Seok Byun, Daejeon (KR); Sang Chan Lee, Daejeon (KR); Sang Ick Lee, Daejeon (KR)

(73) Assignee: DNF CO., LTD., Daejeon (KR)

( * ) Notice: Subject to any disclaimer, the term of this patent is extended or adjusted under 35 U.S.C. 154(b) by 72 days.

(21) Appl. No.: 18/165,870

(22) Filed: Feb. 7, 2023

(65) Prior Publication Data
US 2023/0250114 A1 Aug. 10, 2023

(30) Foreign Application Priority Data

Feb. 8, 2022 (KR) .................. 10-2022-0016153
Jan. 25, 2023 (KR) .................. 10-2023-0009308

(51) Int. Cl.
| | | |
|---|---|---|
| C07F 7/22 | (2006.01) | |
| C01G 19/02 | (2006.01) | |
| C01G 30/00 | (2006.01) | |
| C07F 9/90 | (2006.01) | |
| C23C 16/40 | (2006.01) | |
| C23C 16/455 | (2006.01) | |

(52) U.S. Cl.
CPC ............ *C07F 7/2284* (2013.01); *C01G 19/02* (2013.01); *C01G 30/005* (2013.01); *C07F 9/902* (2013.01); *C23C 16/40* (2013.01); *C23C 16/407* (2013.01); *C23C 16/45536* (2013.01); *C23C 16/45553* (2013.01)

(58) Field of Classification Search
None
See application file for complete search history.

(56) References Cited

U.S. PATENT DOCUMENTS

| | | | |
|---|---|---|---|
| 9,537,095 B2 | 1/2017 | Stender et al. | |
| 9,701,695 B1 * | 7/2017 | Kuchenbeiser | C07F 7/025 |
| 2009/0162973 A1 | 6/2009 | Gatineau et al. | |
| 2014/0329357 A1 | 11/2014 | Stender et al. | |

FOREIGN PATENT DOCUMENTS

KR 20220000366 A 1/2022

OTHER PUBLICATIONS

B. Sekhon et al., 8 Research in Pharmaceutical Sciences, 145-158 (2013) (Year: 2013).*
N. Greenwood et al., Chemistry of the Elements, Chapter 13, Arsenic, Antimony and Bismuth, 547-599 (2nd ed., 1997) (Year: 1997).*
A. Davies et al., Journal of the Chemical Society [Section] C: Organic, 759-765 (1970) (Year: 1970).*
CAS Abstract and Indexed Compounds, S. Sinha, 4 Zeitschrift fuer Chemie, 150-151 (1964) (Year: 1964).*
S. Sinha, 4 Zeitschrift fuer Chemie, 150-151 (1964) (Year: 1964).*
CAS Abstract and Indexed Compounds, D. Hass, 4 Zeitschrift fuer Chemie, 185-186 (1964) (Year: 1964).*
D. Hass, 4 Zeitschrift fuer Chemie, 185-186 (1964) (Year: 1964).*
Email communication from CAS Customer Center help@cas.org (Feb. 25, 2025) (Year: 2025).*
H. Remy et al., 94 Chemische Berichte, 472-479 (1961) (with English-language machine translation) (Year: 1961).*
Taiwanese Patent Office, Office Action Issued in Application No. 112104178, Feb. 6, 2024, 9 pages. (Submitted with Partial English Summary).
Hsu, C. et al., "Synthesis and studies of trimethylamine adducts with tin(II) halides," Inorganic Chemistry, vol. 16, No. 10, Oct. 1, 1977, 6 pages.
"N,N-diethyl-1iodo-1, 1-dimethylstannanamine Stannane, (diethylamnio)iododimethyl-(8CI)," CAS Registry No. 26349-07-5, Entered STN: Nov. 16, 1984, 1 page.
Davies, A. et al., "Organometallic reactions. Part XVII. Some exchange and addition reactions of aminodimethyltin compounds," Journal of the Chemical Society C: Organic, No. 6, 1970, 8 pages.
Hass, D., "Wismut(III)-alkyl(bzw. aryl)imidojodide," Zeitschrift für Chemie, vol. 4, No. 5, May 2010, 4 pages. (Submitted with Machine Translation).
State Intellectual Property Office of the People's Republic of China, Office Action Issued in Application No. 202310144334.5, Feb. 27, 2025, 10 pages.
Hass, D. et al., "Wismut(III)-alkyl(bzw.aryl)imidojodide (Bismuth(III) alkyl (or aryl) imido iodide)," Zeitschrift für Chemie, vol. 4, No. 5, May 1964, 3 pages. (Submitted with Partial English Translation).
Chemical Abstract Compound, CAS Registry No. 92706-14-4 & 94044-22-1, Entered STN: Dec. 17, 1984 & Jan. 2, 1985, 1 page.
Kaufmann, J. et al., "Synthese von methyldihalogenarsinen CH3AsXY mit verschiedenen halogenen XY," Journal of Organometallic Chemistry, vol. 96, No. 2, Aug. 26, 1975, 8 pages.

* cited by examiner

*Primary Examiner* — Alexander R Pagano
(74) *Attorney, Agent, or Firm* — McCoy Russell LLP

(57) ABSTRACT

Provided are an iodine-containing metal compound, a composition for depositing a metal-containing thin film including the same, and a method of manufacturing a metal-containing thin film using the same. Since the composition for depositing a thin film according to one embodiment is present in a liquid state at room temperature, it has excellent storage and handling properties, and since the composition has high reactivity, a metal thin film may be efficiently formed using the composition.

16 Claims, 3 Drawing Sheets

IODINE-CONTAINING METAL COMPOUND AND COMPOSITION FOR DEPOSITING THIN FILM INCLUDING THE SAME

CROSS-REFERENCE TO RELATED APPLICATIONS

This application claims priority under 35 U.S.C. § 119 to Korean Patent Application No. 10-2022-0016153, filed on Feb. 8, 2022, and Korean Patent Application No. 10-2023-0009308, filed on Jan. 25, 2023 in the Korean Intellectual Property Office, the disclosure of which is incorporated herein by reference in its entirety.

TECHNICAL FIELD

The following disclosure relates to an iodine-containing metal compound, a composition for depositing a metal-containing thin film including the same, and a method of manufacturing a metal-containing thin film using the composition for depositing a thin film.

BACKGROUND

A chemically amplified resist (CAR) which is a currently used photoresist was designed for high sensitivity, but since the photoresists were made too transparent at a wavelength of 13.5 nm by a general element constitution (C having smaller quantities of O, F, and S), the sensitivity may be decreased.

In addition, it was reported that as CAR has decreased process efficiency due to a roughness issue in small feature sizes and has a decreased photospeed in a process using an acid catalyst, line edge roughness (LER) is increased, and in order to solve the problem, inorganic compounds for extreme ultraviolet (EUV) lithography are required (Korean Patent Publication No. KR10-2022-0000366A).

SUMMARY

One embodiment is directed to providing an iodine-containing metal compound which may be used as a precursor of a metal-containing thin film, and a composition for depositing a metal-containing thin film including the same.

Another embodiment is directed to providing a method of manufacturing a metal-containing thin film using the composition for depositing a metal-containing thin film.

In one general aspect, a compound represented by the following Chemical Formula 1 is provided:

[Chemical Formula 1]

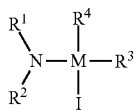

wherein

M is a Group 14 metal, a Group 15 metal, or a Group 16 metal;

$R^1$ is hydrogen or $C_{1-7}$ alkyl;

$R^2$ is $C_{1-7}$ alkyl;

$R^3$ and $R^4$ are independently of each other $C_{1-7}$ alkyl, $C_{2-7}$ alkenyl, or $-NR^5R^6$, in which $R^5$ and $R^6$ are independently of each other hydrogen or $C_{1-7}$ alkyl; and $R^3$ and $R^4$ may not exist independently of each other depending on a metal oxidation number of M.

In another general aspect, a composition for depositing a metal-containing thin film includes the iodine-containing metal compound according to the embodiment.

In still another general aspect, a method of manufacturing a metal-containing thin film using the composition for depositing a metal-containing thin film according to the embodiment is provided.

Other features and aspects will be apparent from the following detailed description, the drawings, and the claims.

DETAILED DESCRIPTION OF EMBODIMENTS

Figure 1:
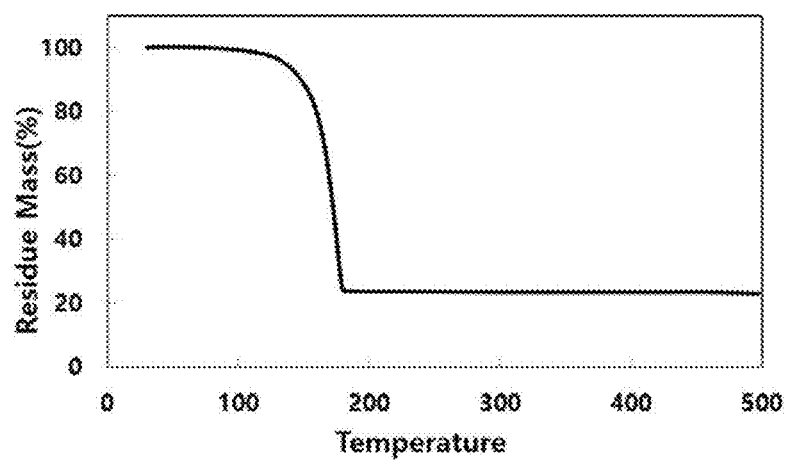
FIG. 1 shows TGA analysis results of t-butylbis(dimethylamino)iodotin prepared in Example 1.

Since the embodiments described in the present specification may be modified in many different forms, the technology according to one embodiment should not be limited to the embodiments set forth herein. Furthermore, throughout the specification, unless otherwise particularly stated, the word "comprise", "equipped", "contain", or "have" does not mean the exclusion of any other constituent element, but means further inclusion of other constituent elements, and elements, materials, or processes which are not further listed are not excluded.

The numerical range used in the present specification includes all values within the range including the lower limit and the upper limit, increments logically derived in a form and span in a defined range, all double limited values, and all possible combinations of the upper limit and the lower limit in the numerical range defined in different forms. As an example, when it is defined that a content of a composition is 10% to 80% or 20% to 50%, it should be interpreted as being that a numerical range of 10% to 50% or 50% to 80% is also described in the specification of the present specification. Unless otherwise defined in the present specification, values which may be outside a numerical range due to experimental error or rounding of a value are also included in the defined numerical range.

Hereinafter, unless otherwise particularly defined in the present specification, "about" may be considered as a value within 30%, 25%, 20%, 15%, 10%, or 5% of a stated value.

In the present specification, "alkyl" refers to a straight chain or branched chain hydrocarbon formed of only carbon and hydrogen atoms, and may have 1 to 7, 1 to 5, or 1 to 4 carbons.

In the present specification, "alkenyl" refers to a hydrocarbon having one or a plurality of carbon-carbon double bonds at any point of a chain, and may be monosubstituted or polysubstituted. For example, an alkenyl group may include a vinyl group, a propenyl group, a butenyl group, a pentenyl group, a hexenyl group, a butadienyl group, a pentadienyl group, a hexadienyl group, and the like.

In the present specification, "leaving group" refers to a functional group or an atom which may be substituted by a substitution reaction (for example, a nucleophilic substitution reaction) by another functional group or atom, and for example, may be mono $C_{1-7}$ alkyl amine or di $C_{1-7}$ alkyl amine, but is not limited thereto.

In the present specification, two alkyl groups included in "dialkylamine" may be the same or different from each other.

In one embodiment, an iodine-containing metal compound represented by the following Chemical Formula 1 is provided:

[Chemical Formula 1]

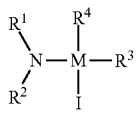

wherein

M is a Group 14 metal, a Group 15 metal, or a Group 16 metal;

IV is hydrogen or $C_{1-7}$ alkyl;

$R^2$ is $C_{1-7}$ alkyl;

$R^3$ and $R^4$ are independently of each other $C_{1-7}$ alkyl, $C_{2-7}$ alkenyl, or $-NR^5R^6$, in which $R^5$ and $R^6$ are independently of each other hydrogen or $C_{1-7}$ alkyl; and $R^3$ and $R^4$ may not exist independently of each other depending on a metal oxidation number of M.

The iodine-containing metal compound according to one embodiment may produce a metal-containing thin film having improved physical properties, when used as a precursor for depositing a thin film, by introducing both a monoalkylamino or dialkylamino group and an iodine group to a metal. In one embodiment, the iodine-containing metal compound contains iodine and a metal, thereby having excellent light absorption rate to EUV and/or light emission rate effect, and thus, the compound may be useful for a hard mask used in a photolithography process.

In one embodiment, IV and $R^2$ may be independently of each other straight chain or branched chain $C_{1-7}$ alkyl, $C_{1-5}$ alkyl, $C_{1-4}$ alkyl, $C_{1-3}$ alkyl, $C_{1-2}$ alkyl, or methyl.

In one embodiment, $R^3$ and $R^4$ may be independently of each other straight chain or branched chain $C_{1-7}$ alkyl, $C_{1-6}$ alkyl, $C_{1-5}$ alkyl, $C_{1-4}$ alkyl, $C_{1-3}$ alkyl, $C_{1-2}$ alkyl, methyl, $C_{2-7}$ alkenyl, $C_{2-6}$ alkenyl, $C_{2-5}$ alkenyl, $C_{2-4}$ alkenyl, $C_{2-3}$ alkenyl, or vinyl (ethenyl). Here, the alkenyl includes the case in which an unsaturated carbon is directly connected or alkylene intervenes in and is connected to an unsaturated carbon. In addition, in one embodiment, $R^3$ and $R^4$ may be independently of each other $-NR^5R^6$, in which $R^5$ and $R^6$ may be independently of each other hydrogen or straight chain or branched chain $C_{1-7}$ alkyl, $C_{1-6}$ alkyl, $C_{1-5}$ alkyl, $C_{1-4}$ alkyl, $C_{1-3}$ alkyl, $C_{1-2}$ alkyl, or methyl.

In one embodiment, M may be Si, Ge, Sn, Pb, P, As, Sb, Bi, S, Se, Te, or Po, and $R^3$ and/or $R^4$ may not exist independently of each other depending on a metal oxidation number of M.

In one embodiment, the iodine-containing metal compound may be a compound represented by the following Chemical Formula 2:

[Chemical Formula 2]

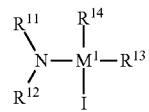

wherein $M^1$ is a Group 14 metal;

$R^{11}$ is hydrogen or $C_{1-7}$ alkyl;

$R^{12}$ is $C_{1-7}$ alkyl; and $R^{13}$ and $R^{14}$ are independently of each other $C_{1-7}$ alkyl, $C_{2-7}$ alkenyl, or $-NR^{15}R^{16}$, in which $R^{15}$ and $R^{16}$ are independently of each other hydrogen or $C_{1-7}$ alkyl.

In one embodiment, $M^1$ may be Sn or Te.

In one embodiment, $R^{11}$ and $R^{12}$ may be independently of each other straight chain or branched chain $C_{1-7}$ alkyl, $C_{1-5}$ alkyl, $C_{1-4}$ alkyl, $C_{1-3}$ alkyl, $C_{1-2}$ alkyl, or methyl.

In one embodiment, $R^{13}$ and $R^{14}$ may be independently of each other straight chain or branched chain $C_{1-7}$ alkyl, $C_{1-6}$ alkyl, $C_{1-5}$ alkyl, $C_{1-4}$ alkyl, $C_{1-3}$ alkyl, $C_{1-2}$ alkyl, methyl, $C_{2-7}$ alkenyl, $C_{2-6}$ alkenyl, $C_{2-5}$ alkenyl, $C_{2-4}$ alkenyl, $C_{2-3}$ alkenyl, or vinyl (ethenyl). Here, the alkenyl includes the case in which an unsaturated carbon is directly connected or alkylene intervenes in and is connected to an unsaturated carbon. In addition, in one embodiment, $R^{13}$ and $R^{14}$ may be independently of each other $-NR^{15}R^{16}$, in which $R^{15}$ and $R^{16}$ may be independently of each other hydrogen or straight chain or branched chain $C_{1-7}$ alkyl, $C_{1-6}$ alkyl, $C_{1-5}$ alkyl, $C_{1-4}$ alkyl, $C_{1-3}$ alkyl, $C_{1-2}$ alkyl, or methyl.

In one embodiment, the iodine-containing metal compound may be a compound represented by the following Chemical Formula 3:

[Chemical Formula 3]

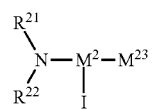

wherein $M^2$ is a Group 15 metal;

$R^{21}$ is hydrogen or $C_{1-7}$ alkyl;

$R^{22}$ is $C_{1-7}$ alkyl; and $R^{23}$ is $C_{1-7}$ alkyl, $C_{2-7}$ alkenyl, or $-NR^{25}R^{26}$ in which $R^{25}$ and $R^{26}$ are independently of each other hydrogen or $C_{1-7}$ alkyl.

In one embodiment, $M^2$ may be Sb or Bi.

In one embodiment, $R^{21}$ and $R^{22}$ may be independently of each other straight chain or branched chain $C_{1-7}$ alkyl, $C_{1-5}$ alkyl, $C_{1-4}$ alkyl, $C_{1-3}$ alkyl, $C_{1-2}$ alkyl, or methyl.

In one embodiment, $R^{23}$ may be straight chain or branched chain $C_{1-7}$ alkyl, $C_{1-6}$ alkyl, $C_{1-5}$ alkyl, $C_{1-4}$ alkyl, $C_{1-3}$ alkyl, $C_{1-2}$ alkyl, methyl, $C_{2-7}$ alkenyl, $C_{2-6}$ alkenyl, $C_{2-5}$ alkenyl, $C_{2-4}$ alkenyl, $C_{2-3}$ alkenyl, or vinyl(ethenyl). Here, the alkenyl includes the case in which an unsaturated carbon is directly connected or alkylene intervenes in and is connected to an unsaturated carbon. In addition, in one embodiment, $R^{23}$ may be $-NR^{25}R^{26}$, in which $R^{25}$ and $R^{26}$ may be independently of each other hydrogen, or straight chain or branched chain $C_{1-7}$ alkyl, $C_{1-6}$ alkyl, $C_{1-5}$ alkyl, $C_{1-4}$ alkyl, $C_{1-3}$ alkyl, $C_{1-2}$ alkyl, or methyl.

In one embodiment, the compound represented by Chemical Formula 2 may be

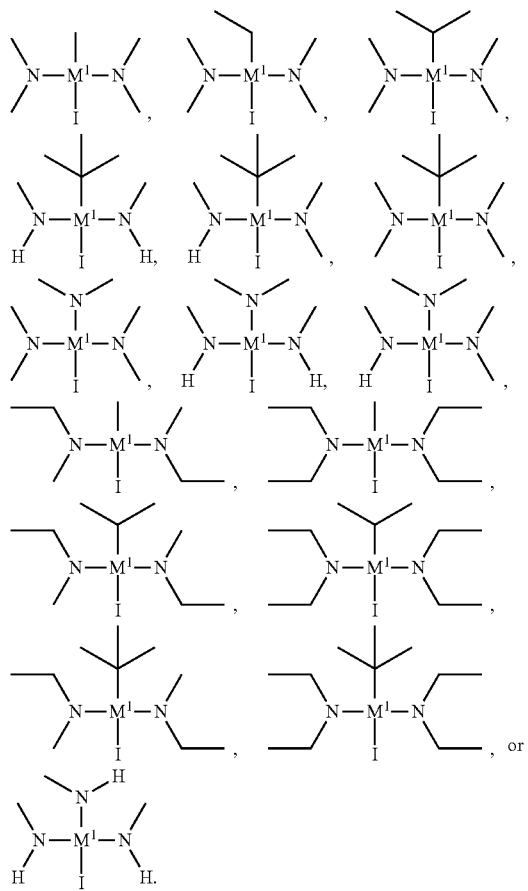

M¹ may be a Group 14 metal, for example, Sn or Te.

In one embodiment, the compound represented by Chemical Formula 3 may be

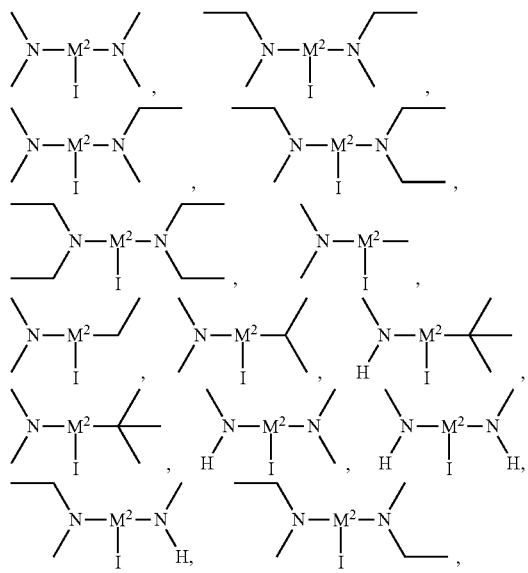

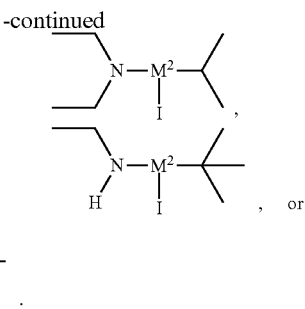

$M^2$ may be a Group 15 metal, for example, Sb or Bi.

However, specific compounds may be an example of the compounds represented by Chemical Formula 1, 2, or 3, and are not necessarily limited thereto.

The compound may be prepared by a method allowed within a range of the recognition of a person skilled in the art disclosed in the present specification.

As a specific example, the iodine-containing metal compound represented by Chemical Formula 1 according to one embodiment may be prepared by reacting a compound of the following Chemical Formula 11 and a compound of the following Chemical Formula 12:

[Chemical Formula 11]

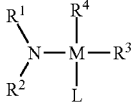

wherein

M is a Group 14 metal, a Group 15 metal, or a Group 16 metal;

$R^1$ is hydrogen or $C_{1-7}$ alkyl;

$R^2$ is $C_{1-7}$ alkyl;

$R^3$ and $R^4$ are independently of each other $C_{1-7}$ alkyl, $C_{2-7}$ alkenyl, or $-NR^5R^6$, in which $R^5$ and $R^6$ are independently of each other hydrogen or $C_{1-7}$ alkyl;

$R^3$ and $R^4$ may not exist independently of each other depending on a metal oxidation number of M; and L is a leaving group, $MI_x$ [Chemical Formula 12]

wherein

M is a Group 14 metal, a Group 15 metal, or a Group 16 metal; and x is selected depending on the oxidation number of M and is an integer of 1 or more.

The above descriptions for Chemical Formula 1 may be applied to M, $R^1$, $R^2$, $R^3$, and $R^4$ of Chemical Formulae 11 and 12.

A method of preparing the iodine-containing metal compound according to an exemplary embodiment may further include synthesizing the iodine-containing metal compound represented by Chemical Formula 1, and purifying the compound at a temperature of about 50° C. to 80° C. or 50° C. to 70° C. and a pressure of 0.1 torr to 1.0 torr or 0.3 torr to 0.8 torr.

In one embodiment, the organic solvent may be a solvent commonly used in organic synthesis, for example, may be hexane, pentane, dichloromethane (DCM), dichloroethane (DCE), toluene, acetonitrile, nitromethane, tetrahydrofuran (THF), N,N-dimethylformamide (DMF), and/or N,N-dimethylacetamide (DMA).

Another embodiment provides a composition for depositing a metal-containing thin film including the iodine-containing metal compound according to an embodiment.

In one embodiment, the composition for depositing a metal-containing thin film includes an iodine-containing metal compound having a metal-iodine (M-I) bond and one or more metal-nitrogen (M-N) bonds, thereby improving reactivity of a metal thin film deposition process using a process such as an atomic layer deposition method and/or a vapor deposition method, and furthermore, increasing the density and the purity of the formed metal-containing thin film.

In addition, the composition for depositing a metal-containing thin film according to an exemplary embodiment includes an iodine-containing metal compound having a metal and an iodine group, whereby a metal-containing thin film manufactured therefrom has excellent light absorption rate to EUA and light emission effect.

In one embodiment, since the composition for depositing a metal-containing thin film is a liquid at room temperature, it is easily handled and stored and may produce various thin films having high purity with a high deposition rate, and a thin film manufactured using the composition for depositing a metal-containing thin film according to one embodiment has excellent durability and electrical properties and also has excellent moisture permeability.

Another embodiment provides a method of manufacturing a metal-containing thin film using the composition for depositing a metal-containing thin film.

In one embodiment, any method may be applied without limitation as long as it is allowed within a range of the recognition of a person skilled in the art disclosed in the present specification, and, it may be performed by for example, atomic layer deposition (ALD), chemical vapor deposition (CVD), metalorganic chemical vapor deposition (MOCVD), low pressure chemical vapor deposition (LPCVD), plasma-enhanced chemical vapor deposition (PECVD), or plasma-enhanced atomic layer deposition (PEALD).

In one embodiment, the method of manufacturing a metal-containing thin film may include the following steps:
maintaining a temperature of a substrate mounted in a chamber at 80° C. to 400° C.;
bringing the iodine-containing composition for depositing a thin film into contact with the substrate to adsorb the composition onto the substrate; and
injecting a reaction gas into the substrate onto which the iodine-containing composition for depositing a thin film is adsorbed to form an iodine-containing thin film.

In one embodiment, the manufacturing method may further include performing a purge to remove unreacted reactants from the vicinity of the formed thin film.

In one embodiment, the reaction gas may be oxygen, ozone, distilled water, hydrogen peroxide, nitrogen monoxide, nitrous oxide, nitrogen dioxide, ammonia, nitrogen, hydrazine, amine, diamine, carbon monoxide, carbon dioxide, saturated or unsaturated $C_{1-12}$ hydrocarbon, hydrogen, argon and/or helium, or mixed gas thereof, but is not necessarily limited thereto.

In the method of manufacturing a metal-containing thin film according to one embodiment, deposition conditions may be adjusted depending on the structure or thermal properties of the thin film to be desired, and an example of the deposition conditions may include an input flow rate of the composition for depositing a metal-containing thin film according to the one embodiment, a reaction gas, an input flow rate of carrier gas, pressure, RF power, a substrate temperature, and the like. For example, the input flow rate of the composition for depositing a metal-containing thin film may be 10 cc/min to 1000 cc/min, the input flow rate of carrier gas may be 10 cc/min to 1000 cc/min, the flow rate of reaction gas may be 1 cc/min to 1500 cc/min, pressure may be 0.5 torr to 10 torr, and RF power may be 50 W to 1000 W or 400 W to 800 W, but these are not necessarily limited thereto.

The substrate used in the method of manufacturing a metal-containing thin film according to one embodiment may be a substrate including one or more semiconductor materials among Si, Ge, SiGe, GaP, GaAs, SiC, SiGeC, InAs, and InP; a SOI (silicon on insulator) substrate; a quartz substrate; a glass substrate for display; or a plastic substrate such as polyimide, polyethylene terephthalate (PET), polyethylene naphthalate (PEN), polymethyl methacrylate (PMMA), polycarbonate (PC), polyethersulfone (PES) and polyester, but not limited thereto.

In addition, the metal-containing thin film may be formed directly on the substrate, but also, a plurality of conductive layers, dielectric layers, insulating layers, or the like may be formed between the substrate and the metal-containing thin film.

Another embodiment provides a multilayer structure in which a metal-containing thin film is deposited on a substrate by using the composition for depositing a metal-containing thin film.

In one embodiment, the thin film may be an oxide film, a nitride oxide, an oxynitride film, a carbon nitride film, or a silicon nitride film, containing iodine and metal (M), or a gate insulation film of a transistor or a dielectric film of a capacitor, and in particular, may be a photoresist thin film using EUV.

Hereinafter, the examples and the experimental examples will be illustrated in detail. However, since the examples and the experimental examples described later only illustrate a part of one embodiment, the technology described in the present specification should not be construed as being limited thereto.

<Example 1> Preparation of t-butylbis(dimethylamino)iodotin

[Chemical Formula A]

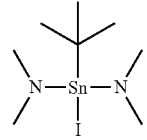

13.0 g (0.042 mol) of t-butyltris(dimethylamino)tin was added to a 500 mL flask, 100 mL of hexene was added thereto, and stirring was performed while maintaining room temperature to prepare a t-butyltris(dimethylamino)tin solution. 10.0 g (0.016 mol) of $SnI_4$ was added to another 500 mL flask, 100 mL of hexene was added thereto, and stirring was performed to sufficiently dilute the solution. The t-butyltris(dimethylamino)tin solution prepared above was slowly added while the internal temperature of the solution was maintained at −10° C., and then stirring was performed at room temperature for 4 hours to synthesize t-butylbis (dimethylamino)iodotin. After the reaction was complete, residues were removed through a filter and the solvent and by-products were removed under reduced pressure. Thereafter, the product was purified at a temperature of 62° C. under a pressure of 0.5 torr to obtain 3 g of t-butylbis (dimethylamino)iodotin.

$^1$H NMR ($C_6D_6$): δ 2.66; (s, 12H), δ 1.14; (s, 9H)

The TGA analysis results of t-butylbis(dimethylamino) iodotin prepared in Example 1 are shown in FIG. 1, and it was found therefrom that the tin compound of Example 1 had a single evaporation step at about 110° C. and the residue mass at 500° C. was confirmed to be 23.4%, from which it was found that the compound showed rapid vaporization properties and vaporized. The results show that the tin compound of Example 1 had excellent thermal stability.

<Example 2> Preparation of tris(dimethylamino)iodotin

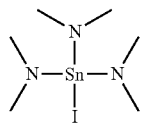

[Chemical Formula B]

7.0 g (0.023 mol) of tetra(dimethylamino)tin was added to a 500 mL flask, 100 mL of ether was added thereto, and stirring was performed while maintaining room temperature to prepare a tetra(dimethylamino)tin solution. 5.0 g (0.008 mol) of $SnI_4$ was added to another 500 mL flask, 100 mL of n-hexene was subsequently added thereto, and stirring was sufficiently performed. The tetra(dimethylamino)tin solution was slowly added while the internal temperature of the solution was maintained at −10° C., and then stirring was performed at room temperature for 4 hours to synthesize tris(dimethylamino)iodotin. After the reaction was complete, residues were removed through a filter, and the solvent and by-products were removed under reduced pressure to obtain tris(dimethylamino)iodotin.

Thereafter, the product was purified at a temperature of 65° C. under a pressure of 0.5 torr to obtain 2 g of tris(dimethylamino)iodotin.

$^1$H NMR ($C_6D_6$): δ 2.54; (s, 18H)

Figure 2:
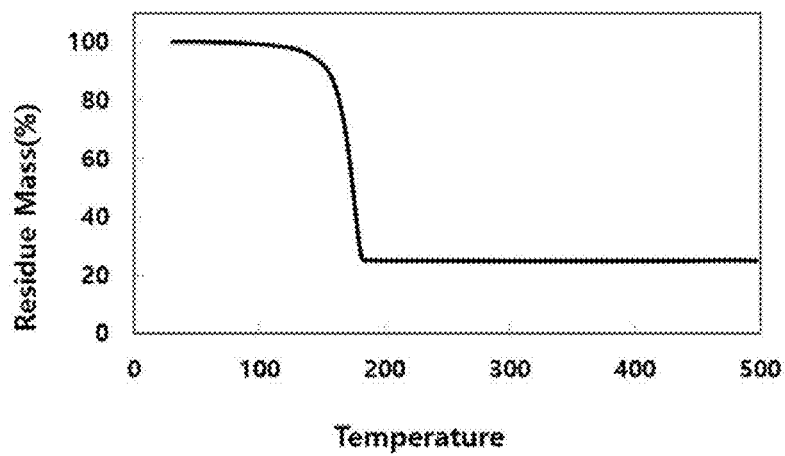
FIG. 2 shows TGA analysis results of tris(dimethylamino)iodotin prepared in Example 2.

The TGA analysis results of tris(dimethylamino)iodotin prepared in Example 2 are shown in FIG. 2, and it was found therefrom that the tin compound of Example 2 had a single evaporation step at about 120° C. and the residue mass at 500° C. was confirmed to be 25.0%, from which it was found that the compound showed rapid vaporization properties and vaporized. The results show that the tin compound of Example 2 had excellent thermal stability.

<Example 3> Preparation of bis(dimethylamino)iodoantimony

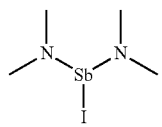

[Chemical Formula C]

5.0 g (0.009 mol) of $SnI_3$ was added to another 500 mL flask, 100 mL of toluene was subsequently added thereto, and stirring was sufficiently performed. 5.0 g (0.019 mol) of the tetra(dimethylamino)antimony was slowly added while the internal temperature of the solution was maintained at −10° C., and then stirring was performed at room temperature for 4 hours to synthesize bis(dimethylamino)iodoantimony. After the reaction was complete, residues were removed through a filter, and the solvent and by-products were removed under reduced pressure to obtain 5 g of bis(dimethylamino)iodoantimony.

Thereafter, the product was purified at a temperature of 50° C. under a pressure of 0.26 torr to obtain 2 g of tris(dimethylamino)iodoantimony.

$^1$H NMR ($C_6D_6$): δ 2.49; (s, 12H)

Figure 3:
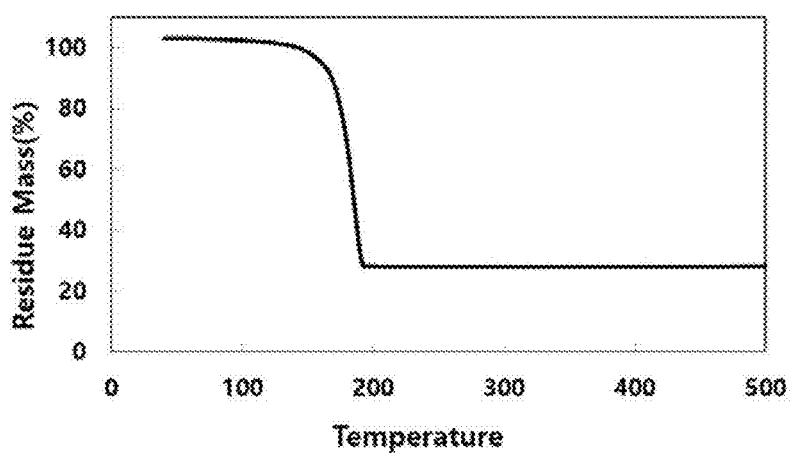
FIG. 3 shows TGA analysis results of bis(methylamino)iodoantimony prepared in Example 3.

The TGA analysis results of bis(dimethylamino)iodoantimony prepared in Example 3 are shown in FIG. 3, and it was found therefrom that the antimony compound of Example 3 had a single evaporation step at about 137° C. and the residue mass at 500° C. was confirmed to be 28.2%, from which it was found that the compound showed rapid vaporization properties and vaporized. The results show that the antimony compound of Example 3 had excellent thermal stability.

<Example 4> Preparation of bis(methylethylamino)iodoantimony

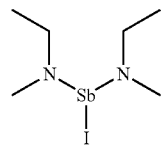

[Chemical Formula D]

5.0 g (0.009 mol) of $SbI_3$ was added to another 500 mL flask, 100 mL of toluene was subsequently added thereto, and stirring was sufficiently performed. 5.6 g (0.02 mol) of the tris(methylethylamino)antimony was slowly added while the internal temperature of the solution was maintained at −10° C., and then stirring was performed at room temperature for 4 hours to synthesize bis(methylethylamino) iodoantimony. After the reaction was complete, residues were removed through a filter, and the solvent and by-products were removed under reduced pressure to obtain 7 g of bis(methylethylamino)iodoantimony.

Thereafter, the product was purified at a temperature of 50° C. under a pressure of 0.19 torr to obtain 2 g of bis(methylethylamino)iodoantimony.

$^1$H NMR ($C_6D_6$): δ 2.36; (q, 4H), δ 2.17; (s, 6H), δ 0.94; (t, 6H)

Figure 4:
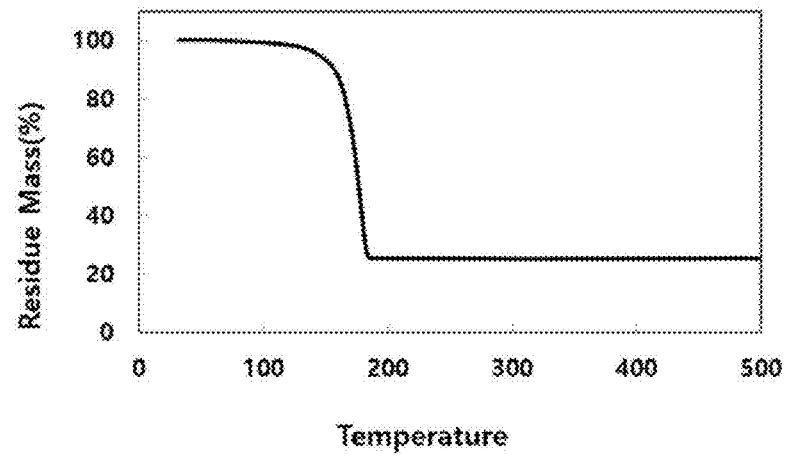
FIG. 4 shows TGA analysis results of bis(dimethylamino)iodoantimony prepared in Example 4.

The TGA analysis results of bis(methylethylamino)iodoantimony prepared in Example 4 are shown in FIG. 4, and it was found therefrom that the antimony compound of Example 4 had a single evaporation step at about 124° C. and the residue mass at 500° C. was confirmed to be 25.1%, from which it was found that the compound showed rapid vaporization properties and vaporized. The results show that the antimony compound of Example 4 had excellent thermal stability.

Example 5

A tin oxide thin film was manufactured by plasma enhanced atomic layer deposition. t-Butylbis(dimethylamino)iodotin prepared in Example 1 was used as a precursor, and an oxygen gas was used as a reaction gas.

As a substrate on which a tin oxide thin film was to be formed, a silicon substrate was used, and the silicon substrate was transferred into a deposition chamber in which the temperature was maintained constantly at the temperature described in Table 1.

The temperature of a bubbler type canister made of stainless steel filled with the precursor was maintained, so that the constant vapor pressure of the precursor described in Table 1 was obtained. The vaporized precursor was transferred into the chamber using an argon gas as a transfer gas, and was adsorbed on a silicon substrate. Thereafter, a purge process was performed using an argon gas. A reaction process was performed using an oxygen gas as a reaction gas at a constant plasma power described in Table 1. In addition, an argon gas was used to perform a purge process for removing a reaction by-product. An atomic layer deposition process as described above was set as one cycle and a tin oxide thin film was formed by repeating the certain cycle, and detailed evaluation conditions and results are shown in Table 1.

In addition, the composition of the tin oxide thin film was analyzed by X-ray photoelectron spectroscopy, and since carbon, nitrogen, and iodine were not detected, it was confirmed that a pure tin oxide thin film was able to be obtained.

TABLE 1

| Precursor | Substrate temperature [° C.] | Precursor vapor pressure [Torr] | Precursor injection Argon bubble [sccm] | Time [sec] | Purge Argon [sccm] | Time [sec] | Reaction Oxygen [sccm] | Plasma power [W] | Time [sec] | Purge Argon [sccm] | Time [sec] | Cycle [No.] | Deposition speed [Å/cycle] |
|---|---|---|---|---|---|---|---|---|---|---|---|---|---|
| Example 1 | Room temperature | 0.1 | 100 | 3 | 600 | 5 | 600 | 400 | 3 | 600 | 5 | 500 | 1.27 |
| | 100 | 0.1 | 100 | 3 | 600 | 5 | 600 | 400 | 3 | 600 | 5 | 500 | 1.17 |
| | 200 | 0.1 | 100 | 3 | 600 | 5 | 600 | 400 | 3 | 600 | 5 | 500 | 1.23 |
| | 400 | 0.1 | 100 | 3 | 600 | 5 | 600 | 400 | 3 | 600 | 5 | 500 | 1.45 |
| | 100 | 0.1 | 100 | 3 | 600 | 5 | 600 | 5 | 3 | 600 | 5 | 500 | 0.82 |
| | 100 | 0.1 | 100 | 3 | 600 | 5 | 600 | 50 | 3 | 600 | 5 | 500 | 1.06 |
| | 100 | 0.1 | 100 | 3 | 600 | 5 | 600 | 100 | 3 | 600 | 5 | 500 | 1.15 |
| | 100 | 0.1 | 100 | 3 | 600 | 5 | 600 | 400 | 3 | 600 | 5 | 500 | 1.17 |
| | 100 | 0.1 | 100 | 3 | 600 | 5 | 600 | 800 | 3 | 600 | 5 | 500 | 1.23 |

Example 6

A tin oxide thin film was manufactured by atomic layer deposition. t-Butylbis(dimethylamino)iodotin prepared in Example 1 was used as a precursor, and an ozone gas was used as a reaction gas.

As a substrate on which a tin oxide thin film was to be formed, a silicon substrate was used, and the silicon substrate was transferred into a deposition chamber in which the temperature was maintained at a constant temperature described in Table 2.

The temperature of a bubbler type canister made of stainless steel filled with the precursor was maintained, so that the constant vapor pressure of the precursor described in Table 2 was obtained. The vaporized precursor was transferred into the chamber using an argon gas as a transfer gas, and was adsorbed on a silicon substrate. Thereafter, an argon gas was used to perform a purge process, and an ozone gas as a reaction gas was used to perform a reaction process. In addition, an argon gas was used to perform a purge process for removing a reaction by-product. An atomic layer deposition process as described above was set as one cycle and a tin oxide thin film was formed by repeating the certain cycle, and detailed evaluation conditions and results are shown in Table 2.

In addition, the composition of the tin oxide thin film was analyzed by X-ray photoelectron spectroscopy, and since carbon and nitrogen were not detected, it was confirmed that a pure tin thin film was obtained.

TABLE 2

| Precursor | Substrate temperature [° C.] | Precursor vapor pressure [Torr] | Precursor injection Argon bubble [sccm] | Time [sec] | Purge Argon [sccm] | Time [sec] | Reaction Ozone [sccm] | Ozone concentration [g/m³] | Time [sec] | Purge Argon [sccm] | Time [sec] | Cycle [No.] | Deposition speed [Å/cycle] |
|---|---|---|---|---|---|---|---|---|---|---|---|---|---|
| Example 1 | Room temperature | 0.1 | 100 | 3 | 600 | 5 | 600 | 220 | 3 | 600 | 5 | 500 | 1.23 |
| | 100 | 0.1 | 100 | 3 | 600 | 5 | 600 | 220 | 3 | 600 | 5 | 500 | 1.10 |
| | 200 | 0.1 | 100 | 3 | 600 | 5 | 600 | 220 | 3 | 600 | 5 | 500 | 1.17 |
| | 400 | 0.1 | 100 | 3 | 600 | 5 | 600 | 220 | 3 | 600 | 5 | 500 | 1.43 |

Example 7

A tin-containing thin film was manufactured by plasma enhanced atomic layer deposition. t-Butylbis(dimethylamino)iodotin prepared in Example 1 was used as a precursor, and a carbon dioxide gas was used as a reaction gas.

As a substrate on which a tin-containing thin film was to be formed, a silicon substrate was used, and the silicon substrate was transferred into a deposition chamber in which the temperature was maintained at a constant temperature described in Table 3.

The temperature of a bubbler type canister made of stainless steel filled with the precursor was maintained, so that the constant vapor pressure of the precursor described in Table 3 was obtained. The vaporized precursor was transferred into the chamber using an argon gas as a transfer gas, and was adsorbed on a silicon substrate. Thereafter, a purge process was performed using an argon gas. A reaction process was performed using a carbon dioxide gas as a reaction gas at a constant plasma power described in Table 3. In addition, an argon gas was used to perform a purge process for removing a reaction by-product. An atomic layer deposition process as described above was set as one cycle and a tin-containing thin film was formed by repeating the certain cycle, and detailed evaluation conditions and results are shown in Table 3.

In addition, the composition of the tin-containing thin film was analyzed by X-ray photoelectron spectroscopy, and was confirmed to be a thin film containing carbon and iodine at 5 to 10%, respectively.

TABLE 3

| Precursor | Substrate temperature [°C.] | Precursor vapor pressure [Torr] | Precursor injection Argon bubble [sccm] | Time [sec] | Purge Argon [sccm] | Time [sec] | reaction Carbon dioxide [sccm] | Plasma power [W] | Time [sec] | Purge Argon [sccm] | Time [sec] | Cycle [No.] | Deposition speed [Å/cycle] |
|---|---|---|---|---|---|---|---|---|---|---|---|---|---|
| Example 1 | Room temperature | 0.1 | 100 | 3 | 600 | 3 | 600 | 50 | 2 | 600 | 3 | 500 | 1.02 |
|  | 100 | 0.1 | 100 | 3 | 600 | 3 | 600 | 50 | 2 | 600 | 3 | 500 | 0.94 |
|  | 200 | 0.1 | 100 | 3 | 600 | 3 | 600 | 50 | 2 | 600 | 3 | 500 | 0.98 |
|  | 400 | 0.1 | 100 | 3 | 600 | 3 | 600 | 50 | 2 | 600 | 3 | 500 | 1.20 |
|  | 100 | 0.1 | 100 | 3 | 600 | 3 | 600 | 5 | 2 | 600 | 3 | 500 | 0.75 |
|  | 100 | 0.1 | 100 | 3 | 600 | 3 | 600 | 50 | 2 | 600 | 3 | 500 | 0.94 |
|  | 100 | 0.1 | 100 | 3 | 600 | 3 | 600 | 100 | 2 | 600 | 3 | 500 | 0.98 |
|  | 100 | 0.1 | 100 | 3 | 600 | 3 | 600 | 400 | 2 | 600 | 3 | 500 | 1.00 |
|  | 100 | 0.1 | 100 | 3 | 600 | 3 | 600 | 800 | 2 | 600 | 3 | 500 | 1.05 |

Example 8

A tin-containing thin film was manufactured by chemical vapor deposition. t-Butylbis(dimethylamino)iodotin prepared in Example 1 was used as a precursor, and water vapor was used as a reaction gas.

As a substrate on which a tin-containing thin film was to be formed, a silicon substrate was used, and the silicon substrate was transferred into a deposition chamber in which the temperature was maintained at a constant temperature described in Table 4.

The temperature of a bubbler type canister made of stainless steel filled with the precursor was maintained, so that the constant vapor pressure of the precursor described in Table 4 was obtained. The vaporized precursor was transferred into the chamber using an argon gas as a transfer gas.

In addition, water vapor as the reaction gas was transferred into the chamber by maintaining the temperature of a bubbler type canister made of stainless steel filled with water so that a constant vapor pressure described in Table 4 was obtained, and using an argon gas as a transfer gas. In addition, a process pressure was adjusted so that the pressure of the chamber was maintained constantly using a throttle valve. As such, the precursor and the water vapor were used to perform chemical vapor deposition to form a tin-containing thin film, and the detailed evaluation conditions and results are shown in Table 4.

In addition, the composition of the tin-containing thin film was analyzed by X-ray photoelectron spectroscopy, and was confirmed to be a thin film containing carbon and iodine at 5 to 10%, respectively.

TABLE 4

| Precursor | Substrate temperature [° C.] | Precursor Vapor pressure [Torr] | Precursor Argon bubble [sccm] | Water Vapor pressure [Torr] | Water Argon bubble [sccm] | Transfer gas argon [sccm] | Process pressure [Torr] | Deposition time [min] | Deposition speed [Å/min] |
|---|---|---|---|---|---|---|---|---|---|
| Example 1 | 70 | 0.1 | 100 | 6 | 10 | 600 | 1 | 10 | 42 |
| | 70 | 0.1 | 100 | 6 | 10 | 600 | 2 | 10 | 48 |
| | 70 | 0.1 | 100 | 6 | 10 | 600 | 3 | 10 | 50 |
| | Room temperature | 0.1 | 100 | 6 | 10 | 600 | 2 | 10 | 85 |
| | 70 | 0.1 | 100 | 6 | 10 | 600 | 2 | 10 | 48 |
| | 200 | 0.1 | 100 | 6 | 10 | 600 | 2 | 10 | 43 |
| | 400 | 0.1 | 100 | 6 | 10 | 600 | 2 | 10 | 52 |

Example 9

The tin-containing thin film manufactured in Example 7 was used to perform patterning of the tin-containing thin film.

In order to form a 1:1 line-space feature at a pitch of 24 nm, in extreme ultraviolet (EUV) lithography equipment, EUV was used with an exposure of about 76 mJ/cm² to perform patterning. Subsequently, firing was performed at about 150° C. for 3 minutes, development was performed in 2-heptanone for about 15 seconds, and rinsing was performed with the same solvent.

Figure 5:
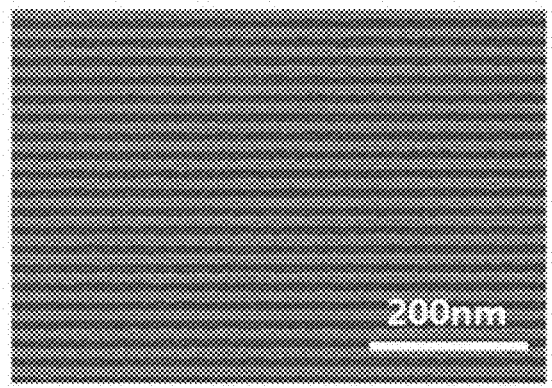
FIG. 5 is a scanning electron microscopic image photograph of a line/space pattern formed on a silicon substrate using a tin compound prepared in Example 1.

FIG. 5 is a scanning electron microscopic image of a line/space pattern formed on a silicon substrate with pitches of 24 nm.

As seen from the pattern images, it was confirmed that a line/space pattern of 1:1 was evenly formed even in a narrow pitch of 24 nm.

Example 10

An antimony oxide thin film was manufactured by plasma enhanced atomic layer deposition. Bis(methylethylamino)iodoantimony prepared in Example 4 was used as a precursor, and an oxygen gas was used as a reaction gas.

As a substrate on which an antimony oxide thin film was to be formed, a silicon substrate was used, and the silicon substrate was transferred into a deposition chamber in which the temperature was maintained constantly at the temperature described in Table 5.

The temperature of a bubbler type canister made of stainless steel filled with the precursor was maintained, so that the constant vapor pressure of the precursor described in Table 5 was obtained. The vaporized precursor was transferred into the chamber using an argon gas as a transfer gas, and was adsorbed on a silicon substrate. Thereafter, a purge process was performed using an argon gas. A reaction process was performed using an oxygen gas as a reaction gas at a constant plasma power described in Table 5. In addition, an argon gas was used to perform a purge process for removing a reaction by-product. An atomic layer deposition process as described above was set as one cycle and an antimony oxide thin film was formed by repeating the certain cycle, and detailed evaluation conditions and results are shown in Table 5.

In addition, the composition of the antimony oxide thin film was analyzed by X-ray photoelectron spectroscopy, and since carbon, nitrogen, and iodine were not detected, it was confirmed that a pure antimony oxide thin film was able to be obtained.

TABLE 5

| Precursor | Substrate temperature [° C.] | Precursor vapor pressure [Torr] | Precursor injection Argon bubble [sccm] | Precursor injection Time [sec] | Purge Argon [sccm] | Purge Time [sec] | Reaction Oxygen [sccm] | Reaction Plasma power [W] | Reaction Time [sec] | Purge Argon [sccm] | Purge Time [sec] | Cycle [No.] | Deposition speed [Å/cycle] |
|---|---|---|---|---|---|---|---|---|---|---|---|---|---|
| Example 4 | Room temperature | 0.1 | 100 | 3 | 600 | 5 | 600 | 400 | 3 | 600 | 5 | 500 | 1.41 |
| | 100 | 0.1 | 100 | 3 | 600 | 5 | 600 | 400 | 3 | 600 | 5 | 500 | 1.30 |
| | 200 | 0.1 | 100 | 3 | 600 | 5 | 600 | 400 | 3 | 600 | 5 | 500 | 1.32 |
| | 400 | 0.1 | 100 | 3 | 600 | 5 | 600 | 400 | 3 | 600 | 5 | 500 | 1.59 |
| | 100 | 0.1 | 100 | 3 | 600 | 5 | 600 | 5 | 3 | 600 | 5 | 500 | 0.91 |
| | 100 | 0.1 | 100 | 3 | 600 | 5 | 600 | 50 | 3 | 600 | 5 | 500 | 1.15 |
| | 100 | 0.1 | 100 | 3 | 600 | 5 | 600 | 100 | 3 | 600 | 5 | 500 | 1.21 |
| | 100 | 0.1 | 100 | 3 | 600 | 5 | 600 | 400 | 3 | 600 | 5 | 500 | 1.30 |
| | 100 | 0.1 | 100 | 3 | 600 | 5 | 600 | 800 | 3 | 600 | 5 | 500 | 1.35 |

Example 11

An antimony oxide thin film was manufactured by atomic layer deposition. Bis(methylethylamino)iodoantimony prepared in Example 4 was used as a precursor, and an ozone gas was used as a reaction gas.

As a substrate on which an antimony oxide thin film was to be formed, a silicon substrate was used, and the silicon substrate was transferred into a deposition chamber in which the temperature was maintained at a constant temperature described in Table 6.

The temperature of a bubbler type canister made of stainless steel filled with the precursor was maintained, so that the constant vapor pressure of the precursor described in Table 6 was obtained. The vaporized precursor was transferred into the chamber using an argon gas as a transfer gas, and was adsorbed on a silicon substrate. Thereafter, an argon gas was used to perform a purge process, and an ozone gas as a reaction gas was used to perform a reaction process. In addition, an argon gas was used to perform a purge process for removing a reaction by-product. An atomic layer deposition process as described above was set as one cycle and an antimony oxide thin film was formed by repeating the certain cycle, and detailed evaluation conditions and results are shown in Table 6.

In addition, the composition of the antimony oxide thin film was analyzed by X-ray photoelectron spectroscopy, and since carbon and nitrogen were not detected, it was confirmed that a pure antimony oxide thin film was obtained.

$R^{13}$ is $C_{1-7}$ alkyl, $C_{2-7}$ alkenyl, or $-NR^{15}R^{16}$;
$R^{14}$ is $-NR^{15}R^{16}$; and
in which $R^{15}$ and $R^{16}$ are independently of each other hydrogen or $C_{1-7}$ alkyl.

2. The iodine-containing metal compound of claim 1, wherein
$R^{11}$, and $R^{12}$ are independently of one another $C_{1-5}$ alkyl;
$R^{13}$ is $C_{1-5}$ alkyl or $C_{2-5}$ alkenyl, or $-NR^{15}R^{16}$;
$R^{14}$ is $-NR^{15}R^{16}$; and
$R^{15}$, and $R^{16}$ are independently of one another hydrogen or $C_{1-5}$ alkyl.

3. The iodine-containing metal compound of claim 1, wherein the compound represented by Chemical Formula 2 is any one selected from the group consisting of the following compounds:

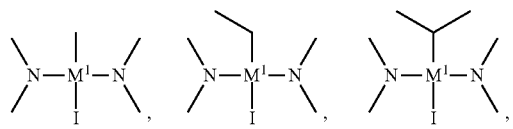

TABLE 6

| Precursor | Substrate temperature [° C.] | Precursor vapor pressure [Torr] | Precursor injection | | Reaction | | | Purge | | Cycle [No.] | Deposition speed [Å/cycle] |
| | | | Argon bubble [sccm] | Time [sec] | Purge | | Ozone | | | | |
| | | | | | Argon [sccm] | Time [sec] | Ozone [sccm] | concentration [g/m³] | Time [sec] | Argon [sccm] | Time [sec] | | |
| Example 4 | Room temperature | 0.1 | 100 | 3 | 600 | 5 | 600 | 220 | 3 | 600 | 5 | 500 | 1.45 |
| | 100 | 0.1 | 100 | 3 | 600 | 5 | 600 | 220 | 3 | 600 | 5 | 500 | 1.21 |
| | 200 | 0.1 | 100 | 3 | 600 | 5 | 600 | 220 | 3 | 600 | 5 | 500 | 1.31 |
| | 400 | 0.1 | 100 | 3 | 600 | 5 | 600 | 220 | 3 | 600 | 5 | 500 | 1.61 |

The present disclosure relates to an iodine-containing metal compound, a composition for depositing a metal-containing thin film including the same, and a method of manufacturing a metal-containing thin film using the same, and since the composition for depositing a thin film according to one embodiment is present in a liquid state at room temperature, it has excellent storage and handling properties, and since the composition has high reactivity, a metal thin film may be efficiently formed using the composition.

Hereinabove, though one embodiment has been described in detail by the examples and the experimental examples, the scope of one embodiment is not limited to specific examples, and should be construed by the appended claims.

What is claimed is:
1. An iodine-containing metal compound represented by the following Chemical Formula 2:

[Chemical Formula 2]

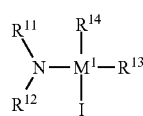

wherein
$M^1$ is a Sn or Pb;
$R^{11}$ is hydrogen or $C_{1-7}$ alkyl;
$R^{12}$ is $C_{1-7}$ alkyl;

-continued

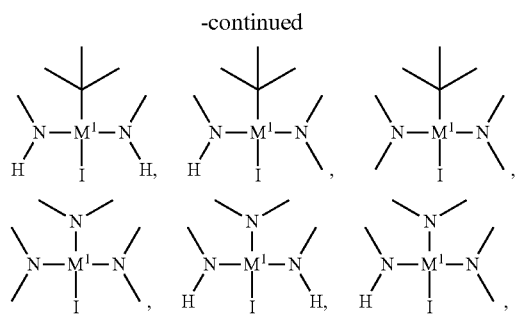

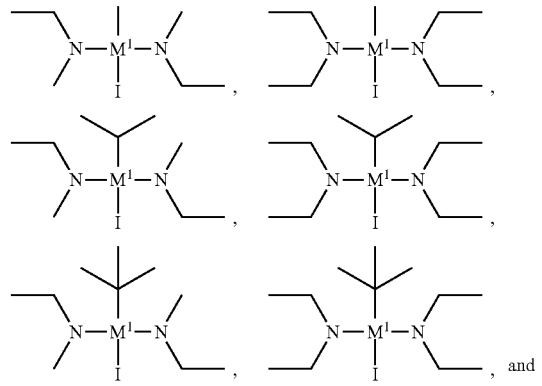

, and

-continued

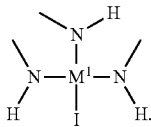

4. A composition for depositing a metal-containing thin film, comprising an iodine-containing metal compound represented by the following Chemical Formula 2:

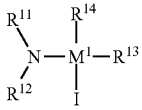

[Chemical Formula 2]

wherein
$M^1$ is a Sn or Pb;
$R^{11}$ is hydrogen or $C_{1-7}$ alkyl;
$R^{12}$ is $C_{1-7}$ alkyl;
$R^{13}$ is $C_{1-7}$ alkyl, $C_{2-7}$ alkenyl, or —$NR^{15}R^{16}$;
$R^{14}$ is —$NR^{15}R^{16}$; and
in which $R^{15}$ and $R^{16}$ are independently of each other hydrogen or $C_{1-7}$ alkyl.

5. A composition for depositing a metal-containing thin film, comprising an iodine-containing metal compound represented by the following Chemical Formula 3:

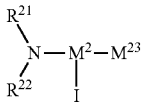

[Chemical Formula 3]

wherein
$M^2$ is a Sb;
$R^{21}$ is hydrogen or $C_{1-7}$ alkyl;
$R^{22}$ is $C_{1-7}$ alkyl; and
$R^{23}$ is $C_{1-7}$ alkyl, $C_{2-7}$ alkenyl, or —$NR^{25}R^{26}$, in which $R^{25}$ and $R^{26}$ are independently of each other hydrogen or $C_{1-7}$ alkyl.

6. A method of manufacturing a metal-containing thin film using the iodine-containing metal compound of claim 1.

7. The method of manufacturing a metal-containing thin film of claim 6, wherein the method includes:
maintaining a temperature of a substrate mounted in a chamber at 30° C. to 400° C.;
bringing the iodine-containing metal compound into contact with the substrate to adsorb the compound onto the substrate; and
injecting a reaction gas into the substrate onto which the iodine-containing metal compound is adsorbed to form a metal-containing thin film.

8. The method of manufacturing a metal-containing thin film of claim 7, wherein the reaction gas is any one or more selected from the group consisting of oxygen, ozone, distilled water, hydrogen peroxide, nitrogen monoxide, nitrous oxide, nitrogen dioxide, ammonia, nitrogen, hydrazine, amine, diamine, carbon monoxide, carbon dioxide, saturated or unsaturated $C_{1-12}$ hydrocarbon, hydrogen, argon, and helium.

9. A method for manufacturing a metal-containing thin film, using the composition for depositing a metal-containing thin film of claim 4.

10. The method for manufacturing a metal-containing thin film of claim 9, wherein the method includes:
maintaining a temperature of a substrate mounted in a chamber at 30° C. to 400° C.;
bringing the composition for depositing a metal-containing thin film including the compound into contact with the substrate to adsorb the compound onto the substrate; and
injecting a reaction gas into the substrate onto which the iodine-containing metal compound is adsorbed to form a metal-containing thin film.

11. The method for manufacturing a metal-containing thin film of claim 9, wherein the reaction gas is any one or more selected from the group consisting of oxygen, ozone, distilled water, hydrogen peroxide, nitrogen monoxide, nitrous oxide, nitrogen dioxide, ammonia, nitrogen, hydrazine, amine, diamine, carbon monoxide, carbon dioxide, saturated or unsaturated $C_{1-12}$ hydrocarbon, hydrogen, argon, and helium.

12. A method for manufacturing a metal-containing thin film, using the composition for depositing a metal-containing thin film of claim 5.

13. An iodine-containing metal compound represented by the following Chemical Formula 3:

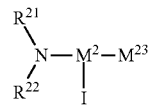

[Chemical Formula 3]

wherein
$M^2$ is a Sb;
$R^{21}$ is hydrogen or $C_{1-7}$ alkyl;
$R^{22}$ is $C_{1-7}$ alkyl; and
$R^{23}$ is $C_{1-7}$ alkyl, $C_{2-7}$ alkenyl, or —$NR^{25}R^{26}$, in which $R^{25}$ and $R^{26}$ are independently of each other hydrogen or $C_{1-7}$ alkyl.

14. The iodine-containing metal compound of claim 13, wherein $R_{21}$, and $R^{22}$ are independently of one another $C_{1-5}$ alkyl; and
$R^{23}$ is $C_{1-5}$ alkyl $C_{2-5}$ alkenyl, or —$NR^{25}R^{26}$; and
$R^{25}$, and $R^{26}$ are independently of one another hydrogen or $C_{1-5}$ alkyl.

15. The iodine-containing metal compound of claim 13, wherein the compound represented by Chemical Formula 3 is any one selected from the group consisting of the following compounds:

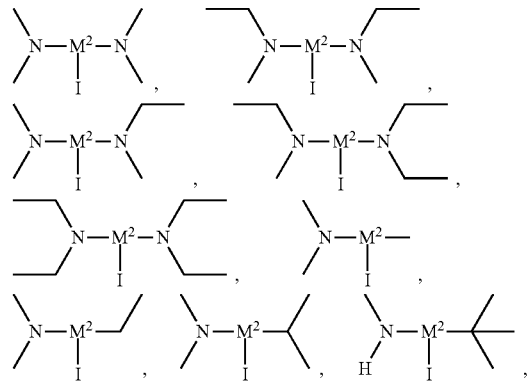

-continued
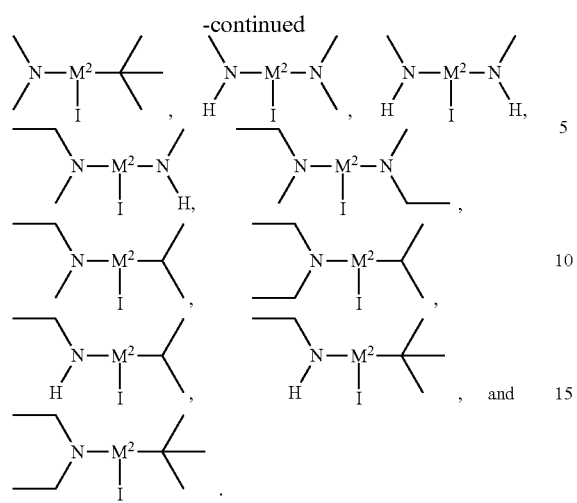
16. A method of manufacturing a metal-containing thin film using the iodine-containing metal compound of claim 13.
* * * * *